US008489807B2

(12) United States Patent
Dodson et al.

(10) Patent No.: US 8,489,807 B2
(45) Date of Patent: Jul. 16, 2013

(54) TECHNIQUES FOR PERFORMING REFRESH OPERATIONS IN HIGH-DENSITY MEMORIES

(75) Inventors: John S. Dodson, Pflugerville, TX (US); Benjiman L. Goodman, Cedar Park, TX (US); Hillery C. Hunter, Deerfield, IL (US); Stephen Powell, Austin, TX (US); Jeffrey A. Stuecheli, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 12/959,637

(22) Filed: Dec. 3, 2010

(65) Prior Publication Data

US 2012/0144105 A1   Jun. 7, 2012

(51) Int. Cl.
*G06F 12/00* (2006.01)

(52) U.S. Cl.
USPC ........................................................ 711/106

(58) Field of Classification Search
None
See application file for complete search history.

(56) References Cited

U.S. PATENT DOCUMENTS

| 5,712,825 | A | 1/1998 | Hadderman et al. |
| 7,734,866 | B2 | 6/2010 | Tsem |
| 7,742,355 | B2 | 6/2010 | Kohler et al. |
| 2001/0009022 | A1 | 7/2001 | Feierbach |
| 2002/0038412 | A1 | 3/2002 | Nizar et al. |
| 2004/0047228 | A1 | 3/2004 | Chen |
| 2008/0049542 | A1 | 2/2008 | Lee et al. |
| 2010/0095058 | A1 | 4/2010 | Proebsting |
| 2010/0128547 | A1 | 5/2010 | Kagami |
| 2012/0144105 | A1 | 6/2012 | Dodson et al. |

FOREIGN PATENT DOCUMENTS

| JP | 10-149311 A | 6/1998 |
| JP | 2002-288035 A | 10/2002 |
| JP | 2004-55084 A | 2/2004 |
| JP | 2005-107648 A | 4/2005 |
| WO | 03032170 A1 | 4/2003 |

OTHER PUBLICATIONS

Kaseridis et al: "Elastic Refresh: Techniques to Mitigate Refresh Penalties in High Density Memory"; 43rd International Symposium on Microarchitecture (MICRO), Dec. 2010 (10 pp).
Bhat et al: "Making DRAM refresh predictable"; Department of Computer Science, North Carolina State University, Raleigh, NC; Springer Science+Business Media, LLC 2011; Published online: May 12, 2011.
Japan Patent Office; Int'l Application PCT/JP2012/006378 filed Oct. 4, 2012; International Search Report and Written Opinion dated Dec. 3, 2012 (8 pgs.).

*Primary Examiner* — Duc Doan
(74) *Attorney, Agent, or Firm* — Yudell Isidore Ng Russell PLLC

(57) ABSTRACT

Techniques for performing refresh operations is disclosed. In response to a completion of a memory operation, a determination is made whether or not a refresh backlog count is greater than a first predetermined value. In a determination that the refresh backlog count is greater than the first predetermined value, a refresh operation is performed as soon as possible. In a determination that the refresh backlog count is not greater than the first predetermined value, a refresh operation is performed after a delay of an idle count value.

10 Claims, 4 Drawing Sheets

TECHNIQUES FOR PERFORMING REFRESH OPERATIONS IN HIGH-DENSITY MEMORIES

BACKGROUND OF THE INVENTION

1. Technical Field

The present disclosure relates to memory refresh operations in general, and in particular to a method and apparatus for performing refresh operations in high-density memories.

2. Description of Related Art

Dynamic random-access memories (DRAMs) are widely employed in a variety of applications. A typical DRAM has multiple blocks of memory cells, and each memory cell includes a capacitor and an access transistor. The capacitor stores a charge related to the value of data stored in a memory cell, and the access transistor selectively couples the capacitor to a bitline for reading from or writing to the memory cell.

Because of various leakage paths, a charge stored within a capacitor of a memory cell will typically dissipate in less than few tens of milliseconds. In order to maintain the integrity of data stored in a memory cell, the memory cell needs to be periodically refreshed by reading the data in the memory cell and rewriting the read (refreshed) data back into the memory cell before a charge stored in a capacitor has had the opportunity to dissipate.

According to the JEDEC standard, a DRAM chip maintains an internal counter that designates the next segment of the DRAM chip to be refreshed, and a memory controller issues an address-less refresh command to the DRAM chip. Two key JEDEC parameters that are closely associated with refresh operations are $t_{REFI}$ and $t_{RFC}$. Parameter $t_{REFI}$ specifies the interval at which refresh commands must be sent to each DRAM chip, and parameter $t_{RFC}$ specifies the amount of time that each refresh ties-up the DRAM interface.

Most conventional memory controllers simply send refresh operations whenever $t_{REFI}$ (which dictates a refresh timer) expires. This is sufficient for older computer systems where refresh operations have a relatively low overhead (i.e., completes quickly) and do not delay read and/or write operations for very long. However, for newer DRAM chips, such as 4-Gbyte and 16-Gbyte DRAM chips, a refresh operation takes a very long time to complete. The net effect is a measurable increase in effective memory latency when read and/or write operations are frequently needed to be stalled in order to accommodate refresh operations.

In addition, there has been tremendous interest in non-DRAM memories (such as PCM, RRAM, and STT-RAM) that may come to market in the next ten years. Many recent works have assumed a primary advantage of these non-DRAM memories is their non-volatility. While these non-DRAM memories are indeed "non-volatile" at traditional Flash temperatures (i.e., ≦55° C.), several of these non-DRAM memories suffer from accelerated drift effects at temperatures in the range of server main memory (i.e., ≦95° C.). Drift effect causes a change in the memory cell's resistance value. While drift effect may be manageable in the initial single-bit-per-cell PCM implementations that are currently on the market, dense multi-level cell PCM relies on storing and sensing finer resistance granularities, and drift effect will become more of an issue. Dense, multi-bit implementations that are currently envisioned for hybrid and tiered memory systems are likely to require a refresh-like command in order to combat drift effect in high-temperature server environments. The length of such an operation are much longer than those of DRAMs. For example, the write time of a phase-change memory may have a drift-compensating $t_{RFC}$ that are three times longer than the write time specified for current DRAMs. Thus, it is clear that simple refresh scheduling mechanisms cannot adequately handle refresh operations for high-density memories.

Consequently, it would be desirable to provide an improved method and apparatus for performing refresh operations in high-density memories.

SUMMARY OF THE INVENTION

In accordance with a preferred embodiment of the present disclosure, in response to a completion of a memory operation, a determination is made whether or not a refresh backlog count is greater than a first predetermined value. In a determination that the refresh backlog count is greater than the first predetermined value, a refresh operation is performed as soon as possible. In a determination that the refresh backlog count is not greater than the first predetermined value, a refresh operation is performed after a delay of an idle count value.

All features and advantages of the present disclosure will become apparent in the following detailed written description.

BRIEF DESCRIPTION OF THE DRAWINGS

The disclosure itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
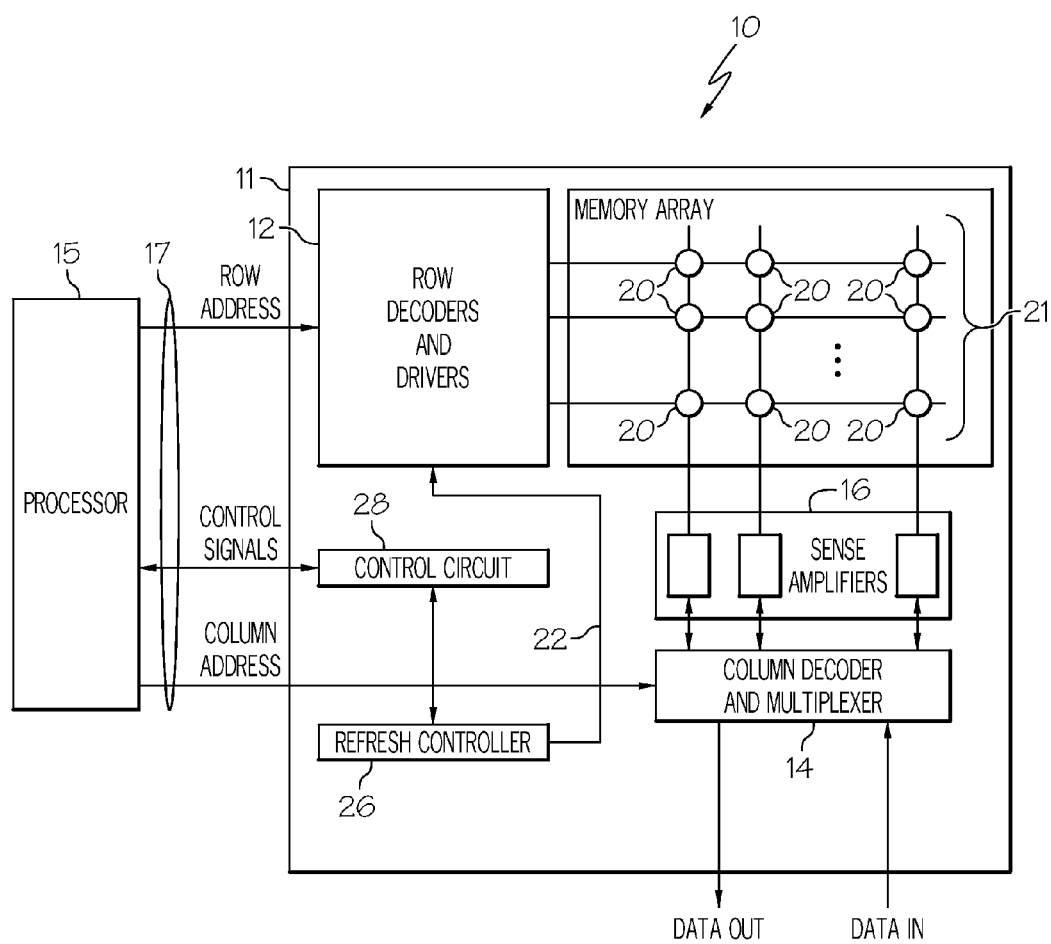
FIG. 1 is a block diagram of an electronic system having a dynamic random-access memory in which a preferred embodiment of the present invention can be implemented.

Referring now to the drawings and in particular to FIG. 1, there is depicted a block diagram of an electronic system having a dynamic random-access memory (DRAM) in which a preferred embodiment of the present invention can be implemented. As shown, a system 10 includes a processor 15 coupled to a DRAM 11 via a bus 17. DRAM 11 includes an array of memory cells 20, row decoders and drivers 12, sense amplifiers 16, and a column decoder and multiplexer 14. DRAM 11 also includes a control circuit 28 and a refresh controller 26. Control circuit 28 receives control signals (e.g., clock, read, write, output enable, data ready, etc.) from processor 15 via bus 17. Control circuit 28 then provides proper internal control signals to various circuits within DRAM 11 to perform read, write, refresh, or idle operations. Control circuit 28 also receives refresh requests from refresh controller 26.

Memory cells 20 can be refreshed with a row-by-row refresh process, i.e., all memory cells in a given one of rows 21 are simultaneously refreshed. Refresh controller 26 determines when and which of memory cells 20 need to be refreshed, and control circuit 28 refreshes each of rows 21 at a time using a refresh address supplied by refresh controller 26.

Conventional memory controllers generally paid little attention to the scheduling of refresh operations because refresh penalties (i.e., conflicts with read and/or write operations) are seldom, if ever, a problem. Thus, many conventional memory controllers, as mentioned previously, tend to use the most straight-forward refresh scheduling algorithm that simply forces a refresh operation to be sent as soon as the $t_{REFI}$ interval expires. This approach is very common due to the simplicity of the control logic hardware required. As the refresh time increases with higher density memories, refresh penalty is becoming an issue for system designers, and a more sophisticated refresh scheduling algorithm is desirable for handing refresh operations in high-density memories.

It has been observed that the probability of receiving a second memory operation (such as read or write) decreases as the time after the completion of a first memory operation increases. Hence, the insertion of a delay before issuing a refresh command can reduce the likelihood that the execution of the refresh operation may interfere with the impending execution of a new memory operation. Thus, after all Bank Queues for a rank are empty, a refresh scheduling mechanism of the present invention waits an additional period of time, by inserting an idle delay, before issuing a refresh command. In contrast, with conventional refresh scheduling mechanisms, refresh commands are immediately issued as soon as all Bank Queues for a rank are empty.

Figure 2:
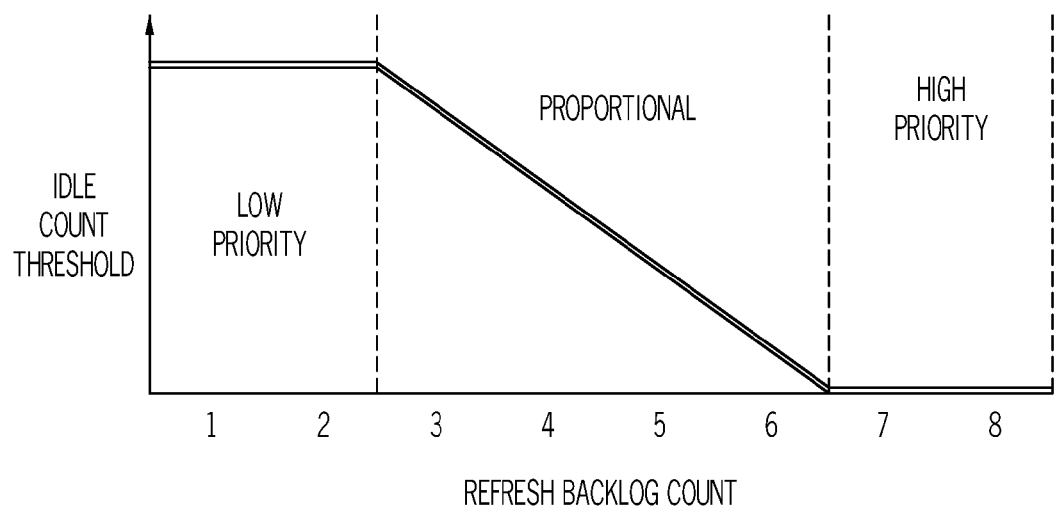
FIG. 2 shows the characteristics of an Idle Delay Function in accordance with a preferred embodiment of the present invention.

The insertion of an idle delay, in essence, further lowers the priority of a refresh operation. The idle delay can be expressed as a function of the refresh backlog count (or refresh delay count). The general form of this function, which can be referred as an Idle Delay Function, is illustrated in FIG. 2. The Idle Delay Function has three distinct regions, namely, a Low-Priority region, a Proportional region and a High-Priority region. Each of the three regions of the Idle Delay Function can be dynamically adjusted according to the workload characteristics. The three regions of the Idle Delay Function are described as follows.

Many workloads in an electronic system have a characteristic idle delay period during which the probability of receiving a memory command within the $t_{RFC}$ interval is very low. Thus, the Idle Delay Function is set to a maximum idle delay value during this period, which is represented by the Low-Priority region.

The Proportional region represents the time frame when the refresh backlog count approaches a predetermined value (3, for example, in FIG. 2) after which a refresh controller needs to start considering the process of issuing refresh commands in a more aggressive manner. The slope of the Idle Delay Function during the Proportional region can be dynamically adjusted in order to exploit the full range of all delayed refresh operations.

As the number of delayed refresh requests (i.e., refresh backlog count) approaches a maximum value (7, for example, in FIG. 2), a refresh operation can no longer be delayed and it must be issued within one additional $t_{REFI}$ interval. From this perspective, the High-Priority region has two phases, both with an idle delay of zero. With the present embodiment, at a refresh backlog count of 7, a refresh controller will send a refresh command as soon as the bank queue becomes empty. In addition, at a refresh delayed count of 8, the refresh command will be issued before any other memory commands, and as soon as the DRAM bus parameters permit.

Since the optimal characteristics of the Idle Delay Function can be workload-dependent, a set of parameters need to be defined in order to configure the Idle Delay Function shown in FIG. 2. These parameters are listed in Table I.

TABLE I

| Parameters | Units | Description |
| --- | --- | --- |
| Max delay | Memory clocks | Set delay in Low-Priority region |
| Proportional slope | Memory clocks; Delayed step | Set slope in Proportional region |
| High-priority pivot point | Delayed step | Set point at which idle delay goes to zero |

The Max delay and Proportional slope parameters can be determined via two hardware structures that profile the workload references.

The goal of the Proportional region is to dynamically center the distribution of refresh operations in the postponed spectrum. This can be accomplished by tracking the relative frequency of refresh operations across a postponed pivot point. This postponed pivot point is the target average refresh execution point. For the present embodiment, a postponed count of 4 is utilized, reflecting the midpoint of the deferral range.

The High-priority pivot point (the transition from Proportional region to High-Priority region) can be fixed at 7 delayed refresh counts, as this was effective to prevent forcing High Priority unnecessarily for the present embodiment.

The hardware structures for implementing the Idle Delay Function from FIG. 2 can be divided into a basic static control mechanism and hardware for dynamically adjusting Max delay, Proportional slope, and High-priority pivot point parameters. For the basic static control mechanism, each memory rank requires a 10-bit idle counter. In addition, Max delay, Proportional slope, and High-priority pivot point parameters require 10-bit, 7-bit, and 3-bit registers, respectively. The hardware for dynamically adjusting the Max delay parameter requires an addition of a 20-bit wide, 10-bit input accumulator and a 10-bit counter. The hardware for generating Proportional slope term includes two 16-bit High/Low counters, a 16-bit integral accumulator, and a 7-bit two-input accumulator. The size of all of the above-mentioned hardware components are negligible compared to the size of a memory controller or refresh controller.

Figure 3A:
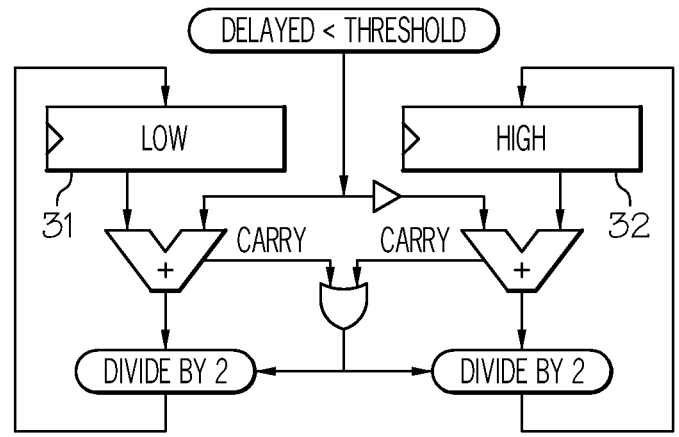
FIGS. 3a-3b depict hardware structures for implementing the Idle Delay function from FIG. 2.
Figure 3B:
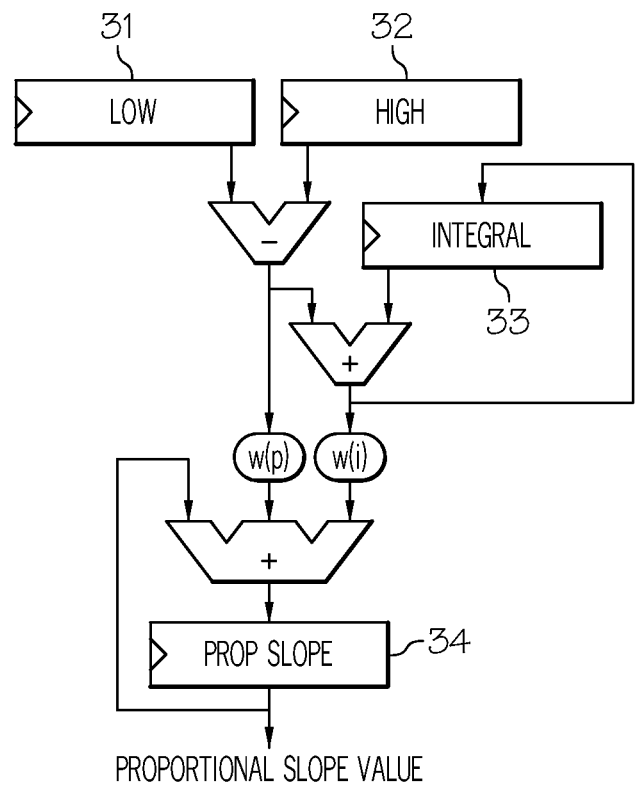

Referring now to FIGS. 3a-3b, there are depicted hardware structures for implementing the Idle Delay Function from FIG. 2. As shown, the structure includes a Low counter 31 and a High counter 32, each containing the frequency of operations that fall on the low and high sides of the High-Priority pivot point, respectively. When either one of Low and High counters 31, 32 overflows, the values in all related counters are divided in half by right-shifting each register by one. The scheme operates over profiling intervals, which are followed by adjustments at the end of each interval. At each adjustment interval, the logic subtracts the values of High and Low counters 31, 32. The value is applied to a proportional integral counter 33 to update the Proportional Slope parameter for the subsequent interval. Circuits for resetting Low and High counters 31, 32 after each adjustment interval are not shown in FIGS. 3a-3b.

For the present embodiment, Low counter 31, High counter 32, and integral counter 33 are 16 bits in width. A relatively short adjustment interval of 128 k memory clocks is utilized since the profiling structure has a fairly small amount of Low counter 31 and High counter 32 update logic state and stabilizes quickly. A 7-bit register 34 is utilized to generate a Proportional Slope value that represents the slope of the Proportional region of the Idle Delay Function from FIG. 2 (units of decrease in delay cycles per postponed step). The w(p) and w(i) weighing functions of integral counter 33 use simple power-of-two division accomplished by truncating the value to largest 5-bit value (shifting off up to 11 leading zeros).

Figure 4:
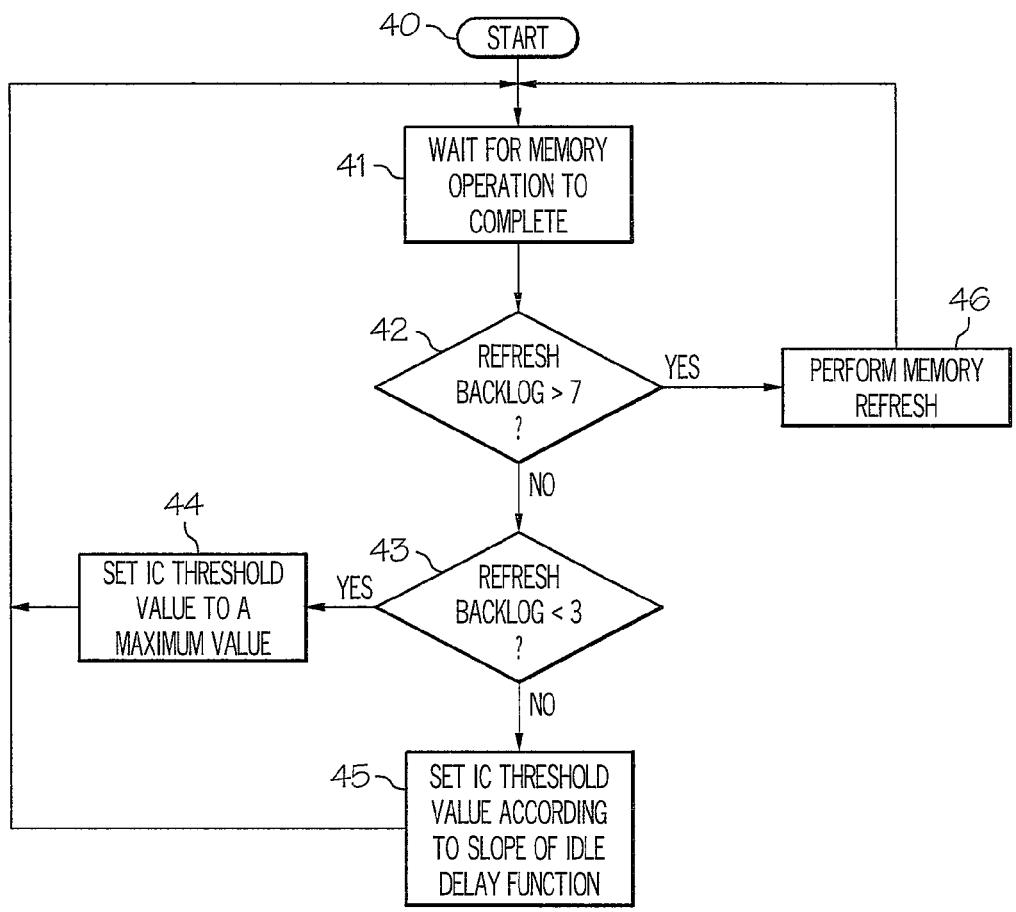
FIG. 4 is a high-level logic flow diagram of a method for performing refresh operations, in accordance with a preferred embodiment of the present invention.

With reference now to FIG. 4, there is illustrated a high-level logic flow diagram of a method for performing refresh operations, in accordance with a preferred embodiment of the present invention. Starting at block 40, the process waits for a memory operation, such as a read or write operation, to complete, as shown in block 41. After the completion of the memory operation, a determination is made whether or not a refresh backlog count is greater than 7, as depicted in block 42. If the refresh backlog count is greater than 7, then the Idle Count threshold is set to zero (or close to zero) such that a refresh operation is performed as soon as possible, as shown in block 46. This corresponds to the High-Priority region of FIG. 2. The process then returns to block 41.

However, if the refresh backlog count is not greater than 7, then another determination is made whether or not the refresh backlog count is less than 3, as shown in block 43. If the refresh backlog count is less than 3, then the Idle Count threshold value is set to a maximum value, as depicted in block 44, such that a refresh operation is performed, as shown in block 46, after a maximum Idle Count threshold value of time has lapsed. This corresponds to the Low-Priority region of FIG. 2. The maximum Idle Count threshold value depends on the memory type. For example, the maximum Idle Count threshold value for 4 Gbyte memories is 12 ns. The process then returns to block 41.

Otherwise, if the refresh backlog count is not less than 3, then the Idle Count threshold value is set to according to the slope of the Idle Delay Function, as shown in block 45, such that a refresh operation is performed, as shown in block 46, after the Idle Count threshold value of time has lapsed. The slope of the Idle Delay Function is determined by the hardware structure from FIG. 3b, and the value can be adjusted according to the desired refresh aggressiveness and load requirement. For example, the Idle Count threshold value decreases linearly as the refresh backlog count increases. This corresponds to the Proportional region of FIG. 2. The process then returns to block 41.

As has been described, the present disclosure provides a method and apparatus for performing refresh operations in high-density memories.

Those skilled in the art will appreciate that the mechanisms of the present invention are capable of being distributed as a program product in a variety of recordable type media such as compact discs and digital video discs.

While the disclosure has been particularly shown and described with reference to a preferred embodiment, it will be understood by those skilled in the art that various changes in form and detail may be made therein without departing from the spirit and scope of the disclosure.

What is claimed is:

1. A non-transitory computer readable medium having a computer program product for performing refresh operations, said computer readable medium comprising:
    computer program code for, in response to a completion of a memory operation, determining whether or not a refresh backlog count is greater than a first predetermined value;
    computer program code for, in a determination that said refresh backlog count is greater than said first predetermined value, performing a refresh operation as soon as possible; and
    computer program code for, in a determination that said refresh backlog count is not greater than said first predetermined value, performing a refresh operation after a delay of an idle count value.

2. The non-transitory computer readable medium of claim 1, wherein said first predetermined value is 7.

3. The non-transitory computer readable medium of claim 1, wherein said idle count value is negatively proportional to said refresh backlog count.

4. The non-transitory computer readable medium of claim 1, wherein said computer readable medium further includes
    determining whether or not said refresh backlog count is less than a second predetermined value;
    in a determination that said refresh backlog count is less than said second predetermined value, performing a refresh operation after a delay of a maximum idle count value.

5. The non-transitory computer readable medium of claim 4, wherein said second predetermined value is 7.

6. An apparatus for performing refresh operations, said apparatus comprising:
    a comparator for, in response to a completion of a memory operation, determining whether or not a refresh backlog count is greater than a first predetermined value; and
    a memory controller for performing a refresh operation as soon as possible in a determination that said refresh backlog count is greater than said first predetermined value, and for performing a refresh operation after a delay of an idle count value in a determination that said refresh backlog count is not greater than said first predetermined value.

7. The apparatus of claim 6, wherein said first predetermined value is 7.

8. The apparatus of claim 6, wherein said idle count value is negatively proportional to said refresh backlog count.

9. The apparatus of claim 6, wherein said memory controller further performs a refresh operation after a delay of a maximum idle count value in a determination that said refresh backlog count is less than a second predetermined value.

10. The apparatus of claim 9, wherein said second predetermined value is 7.

* * * * *